United States Patent
Ogawa et al.

(10) Patent No.: US 7,667,179 B2
(45) Date of Patent: Feb. 23, 2010

(54) RADIATION IMAGE DETECTOR

(75) Inventors: Masaharu Ogawa, Ashigarakami-gun (JP); Katsutoshi Yamane, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/147,786

(22) Filed: Jun. 27, 2008

(65) Prior Publication Data
US 2009/0001254 A1    Jan. 1, 2009

(30) Foreign Application Priority Data
Jun. 27, 2007    (JP) ............... 2007-168505

(51) Int. Cl.
*H01J 40/14* (2006.01)
(52) U.S. Cl. .................... 250/208.1; 257/443
(58) Field of Classification Search ............. 250/208.1, 250/214.1; 257/443–448
See application file for complete search history.

(56) References Cited

U.S. PATENT DOCUMENTS

| | | | |
|---|---|---|---|
| 5,349,174 A * | 9/1994 | Van Berkel et al. | 250/208.1 |
| 6,410,921 B1 * | 6/2002 | Nakazawa | 250/208.1 |
| 6,617,561 B1 * | 9/2003 | Wei et al. | 250/208.1 |
| 2006/0022118 A1 * | 2/2006 | Morii et al. | 250/208.1 |
| 2006/0186316 A1 * | 8/2006 | Miyashita et al. | 250/208.1 |
| 2006/0208162 A1 * | 9/2006 | Inuiya | 250/208.1 |

FOREIGN PATENT DOCUMENTS

| JP | 2005-183670 A | 7/2005 |
|---|---|---|
| JP | 2006-156555 A | 6/2006 |

* cited by examiner

*Primary Examiner*—Seung C Sohn
(74) *Attorney, Agent, or Firm*—Sughrue Mion, PLLC

(57) ABSTRACT

A radiation image detector is provided. The radiation image detector is constituted by: a photoconductive layer that generates charges when electromagnetic waves are irradiated thereon; a common electrode to which a predetermined voltage is applied, provided on one side of the photoconductive layer; a plurality of divided electrodes that output signals corresponding to charges which are generated within the photoconductive layer, provided on the other side of the photoconductive layer; and protective layers that cover the edges of the divided electrodes, the edges being the side surfaces and portions of surfaces of the divided electrodes, which are continuous with the side surfaces, that face the photoconductive layer. The interfaces between the protective layers and the photoconductive layer are smooth surfaces across the entireties thereof.

7 Claims, 4 Drawing Sheets

RADIATION IMAGE DETECTOR

BACKGROUND OF THE INVENTION

1. Field of the Invention

The present invention is related to a radiation image detector that records radiation images, by generating electric charges when irradiated by radiation and accumulating the generated electric charges.

2. Description of the Related Art

Various types of radiation image detectors that generate electric charges when irradiated by radiation which has passed through subjects, temporarily accumulate the generated electric charges in charge accumulating sections, convert the accumulated electric charges into electrical signals, then output the electrical signals have been proposed, for use in the field of medicine and the like. Various types of radiation image detectors have been proposed. Classified based on the process which is employed to read out the accumulated electric charges, there are radiation image detectors of the optical readout type and radiation image detectors of the Thin Film Transistor type (hereinafter, referred to as "TFT type"). Radiation image detectors of the optical readout type read out the accumulated electric charges by irradiating readout light onto the detectors. Radiation image detectors of the TFT type read out the accumulated electric charges by turning electrical switches such as TFT's ON and OFF, pixel by pixel.

The aforementioned radiation image detectors are equipped with: a photoconductive layer that generates charges when radiation is irradiated thereon; a common electrode to which a predetermined voltage is applied, provided on the side of the photoconductive layer onto which the radiation is irradiated; and a plurality of divided electrodes provided on the side of the photoconductive layer opposite that of the common electrode. An electric field is formed within the photoconductive layer by applying high voltage between the common electrode and the divided electrodes. The electric charges, which are generated within the photoconductive layer due to irradiation of radiation which has passed through a subject, are caused to move to the divided electrodes by the electric field. Radiation is detected by reading out the electric charges which are collected at the divided electrodes as radiation detection signals.

Japanese Unexamined Patent Publication No. 2006-156555 discloses a radiation image detector of the TFT readout type. An insulative film, or an insulative material that includes carbon particles or metallic particles is provided to cover all pixel electrodes of this radiation image detector, in order to improve flatness and film properties.

Japanese Unexamined Patent Publication No. 2005-183670 discloses a radiation image detector of the optical readout type. Insulative films are provided at the edges of divided electrodes of this radiation image detector, in order to prevent dark current from being generated at the edges of the divided electrodes.

In the configuration disclosed by Japanese Unexamined Patent Publication No. 2006-156555, the pixel electrodes are covered by the insulative film. However, the insulative film covers the flat electrode portions of the pixel electrodes, in addition to the edges thereof. Therefore, the charge transport properties are poor, resulting in reduced sensitivity and poor residual image characteristics.

In the configuration disclosed by Japanese Unexamined Patent Publication No. 2005-183670, the edges of the divided electrodes are covered by the protective films. However, as illustrated in FIG. 7, simply providing the protective films results in cracking of a photoconductive layer 2 and deterioration of electrical properties (increase in dark current) at the angular portions that exist at the interface between the protective films 59 and the photoconductive layer 2. An advantageous effect that electric fields which are generated between a common electrode 1 and divided electrodes 5a and 5b are prevented from being concentrated at the edges of the divided electrodes 5a and 5b can be obtained, by providing the protective films 59 at the edges thereof. However, because the protective films 59 are of a uniform thickness, the electric fields which are formed at the divided electrodes 5a and 5b become nonuniform, for example, being greater toward positions Pb toward the edges of the divided electrodes 5a and 5b than at positions Pa at the centers thereof. Accordingly, there is a possibility that image quality will suffer.

SUMMARY OF THE INVENTION

The present invention has been developed in view of the foregoing circumstances. It is an object of the present invention to provide a radiation image detector in which cracking of a photoconductive layer and deterioration in electrical properties can be prevented, and in which the uniformity of electric fields formed between a common electrode and divided electrodes is improved.

A radiation image detector of the present invention comprises:

a photoconductive layer that generates charges when electromagnetic waves are irradiated thereon;

a common electrode to which a predetermined voltage is applied, provided on one side of the photoconductive layer;

a plurality of divided electrodes that output signals corresponding to charges which are generated within the photoconductive layer, provided on the other side of the photoconductive layer; and protective layers that cover the edges of the divided electrodes, the edges being the side surfaces and portions of surfaces of the divided electrodes, which are continuous with the side surfaces, that face the photoconductive layer; wherein:

the interfaces between the protective layers and the photoconductive layer are smooth surfaces across the entireties thereof.

Here, the "electromagnetic waves" refers to light, radiation, and the like.

The phrase "smooth surfaces across the entireties thereof" refers to surfaces not having any angular portions across the entireties thereof. The referent of this phrase includes surfaces that have planar surfaces at portions thereof, in addition to surfaces that have smooth curves across the entireties thereof.

It is preferable for the radius of curvature at the interface between the protective layer and the photoconductive layer of the radiation image detector to be 5 μm or greater.

It is also preferable for the thickness of a part of the protective layers, the part covering the portions of the surfaces of the divided electrodes that face the photoconductive layer, to be thicker toward the edges of the divided electrodes.

Here, the phrase "thickness of a part of the protective layers, the part covering the portions of the surfaces of the divided electrodes that face the photoconductive layer" refers to the thickness of the protective layers in a direction perpendicular to the direction in which the surfaces of the portions of the divided electrodes that face the photoconductive layer extend. The phrase "to be thicker toward the edges of the divided electrodes" includes cases in which the thickness increases as a whole with portions that have uniform thicknesses, in addition to cases in which there is a constant increase in thickness.

The contact angle formed by the interfaces between the protective layers and the photoconductive layer and the surfaces of the portions of the divided electrodes that face the photoconductive layer may be greater than or equal to 10 degrees and less than or equal to 65 degrees.

Here, the "contact angle" refers to an angle formed by a surface at which the interface contacts the portion of a divided electrode that faces the photoconductive layer with respect to the surface of the portion of the divided electrode that faces the photoconductive layer.

The radiation image detector of the present invention comprises: a photoconductive layer that generates charges when electromagnetic waves are irradiated thereon; a common electrode to which a predetermined voltage is applied, provided on one side of the photoconductive layer; a plurality of divided electrodes that output signals corresponding to charges which are generated within the photoconductive layer, provided on the other side of the photoconductive layer; and protective layers that cover the edges of the divided electrodes, the edges being the side surfaces and portions of surfaces of the divided electrodes, which are continuous with the side surfaces, that face the photoconductive layer. The interfaces between the protective layers and the photoconductive layer are smooth surfaces across the entireties thereof. That is, there are no angular portions in the interfaces. Therefore, cracking of the photoconductive layer due to localized force concentration at the angular portions can be prevented, as well as deterioration of electrical properties.

The radius of curvature at the interfaces between the protective layers and the photoconductive layer may be 5 μm or greater. In this case, the interfaces can be surfaces having smooth gradual curves. Thereby, the steps within a backing surface on which the photoconductive layer is formed can be made smaller, and cutoff of the photoconductive layer at the steps can be prevented.

The thickness of a part of the protective layers, the part covering the portions of the surfaces of the divided electrodes that face the photoconductive layer, may be thicker toward the edges of the divided electrodes. In this case, the uniformity of electric fields formed between the common electrode and the divided electrodes can be improved.

BEST MODE FOR CARRYING OUT THE INVENTION

Figure 1:
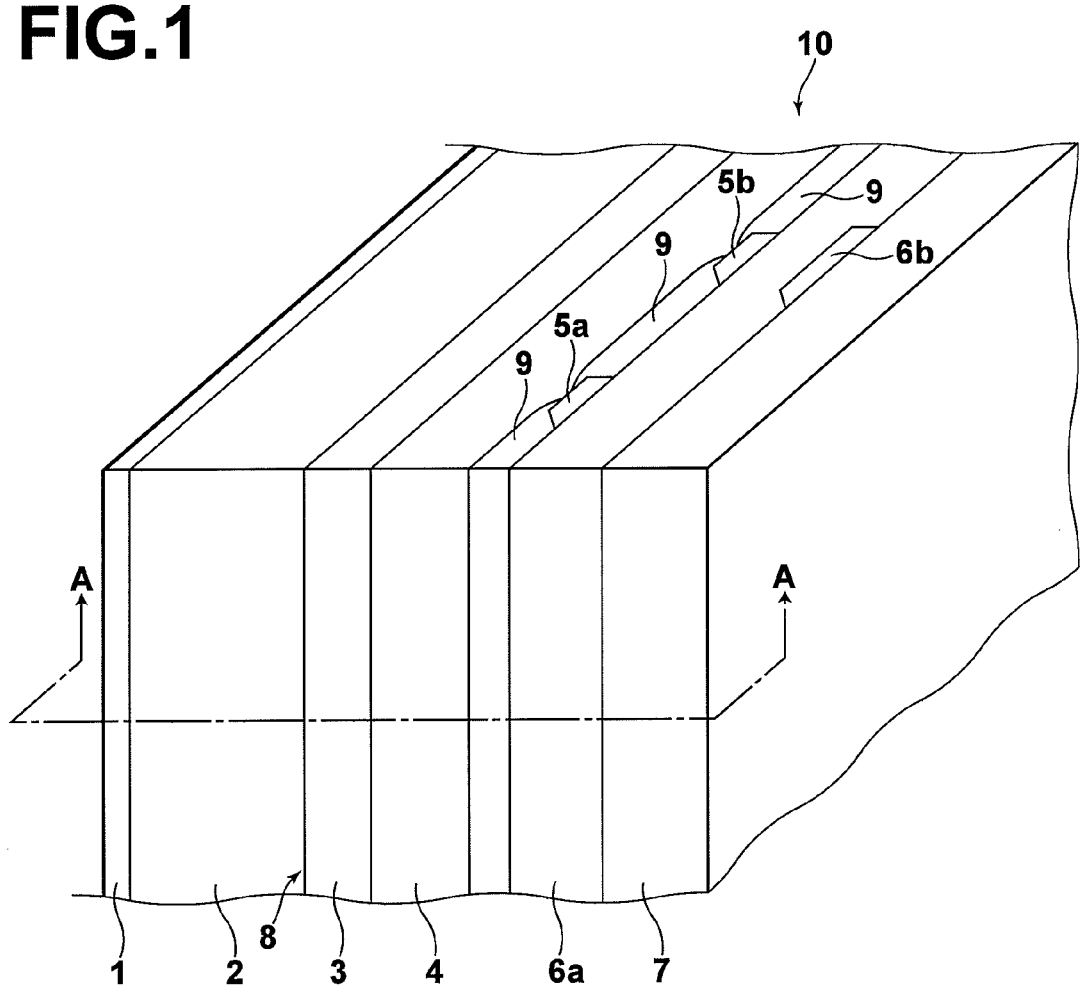
FIG. 1 is a perspective view that illustrates the schematic structure of a flat panel of a radiation image detector of the present invention.
Figure 2:
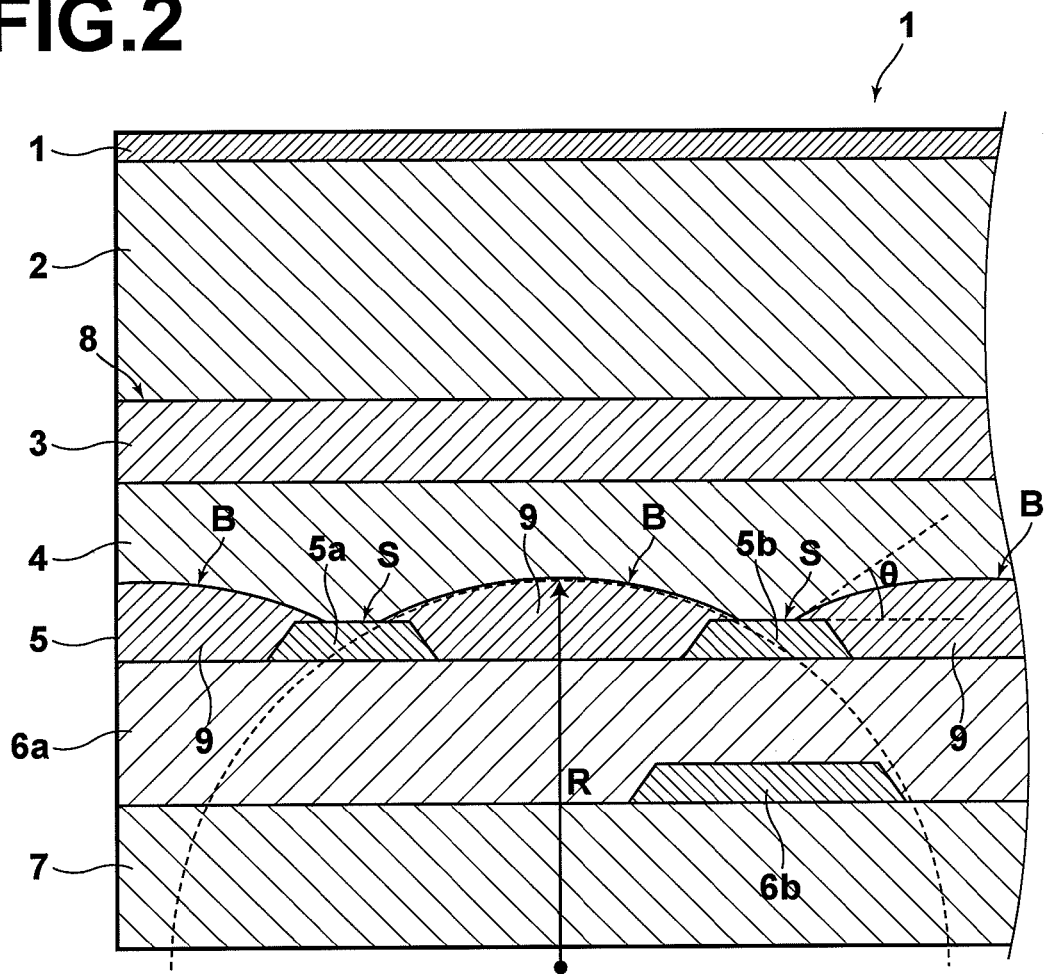
FIG. 2 is a sectional view of the flat panel, taken along line A-A of FIG. 1.

Hereinafter, a radiation image detector according to an embodiment of the present invention will be described with reference to the attached drawings. FIG. 1 is a perspective view that illustrates the schematic structure of a flat panel 10 of the radiation image detector of the present invention. FIG. 2 is a sectional view taken along line A-A of FIG. 1.

The flat panel 10 comprises: a common electrode 1 which is transmissive with respect to radiation; a recording photoconductive layer 2 that generates charges and exhibits conductivity when irradiated by the radiation transmitted through the common electrode 1; a charge transport layer 3, which functions as an insulator with respect to latent image charges which are generated within the photoconductive layer 2 and as a conductor with respect to electric charges of a polarity opposite that of the latent image charges; a readout photoconductive layer 4 that generates charges when irradiated by readout light; a second electrode layer 5 having a plurality of first linear electrodes 5a and a plurality of second linear electrodes 5b for detecting signals corresponding to the charges generated in the recording photoconductive layer 2; a transparent insulating layer 6a which is insulative and is transmissive with respect to the readout light; and color filter layers 6b, which are provided at positions corresponding to the second linear electrodes 5b and are opaque with respect to the readout light.

Further, the interface between the recording photoconductive layer 2 and the charge transport layer 3 functions as an accumulating section 8, at which electric charges generated within the recording photoconductive layer 2 that bear a radiation image are accumulated. Note that the above layers are formed on a substrate 7, which is a glass plate that transmits the readout light or the like, starting with the color filter layers 6b and the transparent insulating layer 6a.

As a characteristic feature of the flat panel 10, insulative protective films 9 are provided at the edges of the first linear electrodes 5a and the second linear electrodes 5b.

The size (area) of the flat panel 10 is 18 cm by 18 cm or greater, for example, with an effective size of 43 cm by 43 cm in the case that the flat panel 10 is to be used for chest X-rays.

The common electrode 1 may be formed by any material as long as it transmits radiation, and thin metal films are preferred examples. Examples of such materials include: Au; Ni; Cr; Pt; Ti; Al; Cu; Pd; Ag; Mg; 3 to 20% MgAg alloys; Mg—Ag intermetallic compounds; 3 to 20% MgCu alloys; and Mg—Cu intermetallic compounds.

Au, Pt, and Mg—Ag intermetallic compounds are particularly favorable for use as the material of the common electrode 1. In the case that Au is used, for example, the thickness of the common electrode 1 is preferably greater than or equal to 15 nm and less than or equal to 200 nm, and more preferably greater than or equal to 30 nm and less than or equal to 100 nm. In the case that 3 to 20% MgAg alloys are used, the thickness of the common electrode 1 is preferably greater than or equal to 100 nm and less than or equal to 400 nm. An example of a method by which the common electrode 1 may be formed is vapor deposition by electrical resistance heating. Alternatively, the common electrode 1 may be formed by any desired method.

The recording photoconductive layer 2 is formed by a material that generates electric charges by being irradiated with radiation. A compound having at least one of: an amorphous selenium compound; $Bi_2MO_{20}$ (M: Ti, Si, Ge); $Bi_4M_3O_{12}$ (M: Ti, Si, Ge); $Bi_2O_3$; $BiMO_4$ (M:Nb, Ta, V); $Bi_2WO_6$; $Bi_{24}B_2O_{39}$; ZnO; ZnS; ZnSe; ZnTe; $MnbO_3$ (M: Li, Na, K); PbO; $HgI_2$; $PbI_2$; CdS; CdSe; CdTe; $BiI_3$; and GaAs as a main component may be used as the material for the recording photoconductive layer 2. Among these, it is preferable to use an amorphous selenium compound, which has a comparatively high quantum efficiency with respect to radiation and high dark resistance.

In the case that an amorphous selenium compound is employed as the material of the recording photoconductive layer 2, the layer may be doped with: an alkali metal such as Li, Na, K, Cs, and Rb, at a concentration greater than or equal to 0.001 ppm and less than or equal to 1 ppm; a fluoride such as LiF, NaF, KF, CsF, and RbF, at a concentration greater than or equal to 0.1 ppm and less than or equal to 1000 ppm; P, As, Sb, and Ge at a concentration greater than or equal to 50 ppm and less than or equal to 5000 ppm; As at a concentration greater than or equal to 10 ppm and less than or equal to 5000 ppm; or Cl, Br, and I at a concentration greater than or equal to 1 ppm and less than or equal to 100 ppm. It is particularly preferable to use amorphous selenium doped with As at a concentration greater than or equal to 10 ppm and less than or equal to 200 ppm; amorphous selenium containing As at greater than or equal to 0.2% and less than or equal to 1% and doped with Cl at a concentration greater than or equal to 5 ppm and less than or equal to 100 ppm; or amorphous selenium containing As at a concentration greater than or equal to 0.2% and less than or equal to 1% and doped with an alkali metal at a concentration greater than or equal to 0.001 ppm and less than or equal to 1 ppm.

Amorphous selenium that contains fine photoconductive particles, such as: $Bi_2MO_{20}$ (M: Ti, Si, Ge); $Bi_4M_3O_{12}$ (M: Ti, Si, Ge); $Bi_2O_3$; $BiMO_4$ (M:Nb, Ta, V); $Bi_2WO_6$; $Bi_{24}B_2O_{39}$; ZnO; ZnS; ZnSe; ZnTe; $MnbO_3$ (M: Li, Na, K); PbO; $HgI_2$; $PbI_2$; CdS; CdSe; CdTe; $BiI_3$; and GaAs; at particle sizes from several nm's to several μm's may also be employed.

The thickness of the recording photoconductive layer 2 is preferably greater than or equal to 100 μm and less than or equal to 2000 μm in the case that an amorphous selenium compound is used as the material. It is particularly preferable for the thickness of the photoconductive layer 2 to be greater than or equal to 150 μm and less than or equal to 250 μm in the case that the flat panel 10 is used for mammography, and to be greater than or equal to 500 μm and less than or equal to 1200 μm in the case that the flat panel 10 is used for other purposes.

The charge transport layer 3 may be formed by any material, as long as it is insulative with respect to electric charges of a polarity which is desired to be accumulated, and conductive with respect to electric charges of the opposite polarity. In the material, it is preferable for a difference of $10^3$ or greater to be present between the products of motility and life of charges of the two polarities. Examples of materials for the charge transport layer 3 include polymers, such as: organic acrylic resins; polyimides; BCB; PVA; acrylics; polyethylenes; polycarbonates; and polyether imides; sulfides, such as: $As_2S_3$; $Sb_2S_3$; and ZnS; oxides, and fluorides. Examples of preferred compounds include: $As_2Se_3$; $As_2Se_3$ doped with Cl, Br, and I at a concentration greater than or equal to 500 ppm and less than or equal to 20000 ppm; $As_2(Se_xTe_{1-x})_3$ (0.5<x<1), which is $As_2Se_3$ in which up to 50% of Se is replaced with Te; $As_2Se_3$ in which up to 50% of Se is replaced with S; $As_2Se_3$ in which the concentration of As is varied ±15%; and amorphous Se—Te, in which the concentration of Te is greater than or equal to 5 wt % and less than or equal to 30 wt %.

In the case that materials containing the aforementioned chalcogenides are employed, it is preferable for the thickness of the charge transport layer 3 to be greater than or equal to 0.4 μm and less than or equal to 3.0 μm, and more preferably greater than or equal to 0.5 μm and less than or equal to 2.0 μm. The charge transport layer 3 may be formed by a single film forming operation, or by a plurality of film forming operations.

Preferred organic films for the charge transport layer 3 include polymers such as: organic acrylic resins; polyimides; BCB; PVA; acrylics; polyethylenes; polycarbonates; and polyether imides, doped with charge transporting materials. The charge transporting materials may be selected from among molecules of: tris(8-quinolinolato) aluminum (Alq3); N,N'-diphenyl-N,N'-di(m-tolyl)benzene (TPD); polyparaphenylene vinylene (PPV); polyalkyl thiophene; polyvinyl carbazole (PVK); metallic phthalocyanine; (4-dicyano methylene)-2-methyl-6-(p-dimethyl aminostyryl)-4H-pyrane (DCM); liquid crystal molecules; hexapentiroxy triphenylene; discotic liquid crystals having central cores that contain π conjugated condensed rings or transition metals; carbon nanotubes; and fullerenes. The amount of molecules to be doped can be set at a value greater than or equal to 0.1 wt % and less than or equal to 50 wt %.

The readout photoconductive layer 4 is formed by a photoconductive substance that exhibits conductivity when irradiated with readout light. The substance is preferably a semiconductor having an energy gap greater than or equal to 0.7 eV and less than or equal to 2.5 eV, such as: an amorphous selenium compound; amorphous Si:H; crystal Si; and GaAs. Amorphous selenium is particularly preferred.

In the case that an amorphous selenium compound is employed as the material of the readout photoconductive layer 4, the layer may be doped with: an alkali metal such as Li, Na, K, Cs, and Rb, at a concentration greater than or equal to 0.001 ppm and less than or equal to 1 ppm; a fluoride such as LiF, NaF, KF, CsF, and RbF, at a concentration greater than or equal to 10 ppm and less than or equal to 10000 ppm; P, As, Sb, and Ge at a concentration greater than or equal to 50 ppm and less than or equal to 5000 ppm; As at a concentration greater than or equal to 10 ppm and less than or equal to 5000 ppm; or Cl, Br, and I at a concentration greater than or equal to 1 ppm and less than or equal to 100 ppm. It is particularly preferable to use amorphous selenium doped with As at a concentration greater than or equal to 10 ppm and less than or equal to 200 ppm; amorphous selenium containing As greater than or equal to 0.2% and less than or equal to 1% and doped with Cl at a concentration greater than or equal to 5 ppm and less than or equal to 100 ppm; or amorphous selenium containing As at a concentration greater than or equal to 0.2% and less than or equal to 1% and doped with an alkali metal at a concentration greater than or equal to 0.001 ppm and less than or equal to 1 ppm.

The readout photoconductive layer 4 is to be of a thickness that enables sufficient absorption of the readout light, while also enabling charges generated therein by irradiation of the readout light to be drifted by the electrical fields formed by the charges accumulated in the accumulating section. The thickness of the readout photoconductive layer 4 is preferably greater than or equal to 1 μm and less than or equal to 30 μm.

The first linear electrodes 5a and the second linear electrodes 5b are linear electrodes that extend in the vertical direction of FIG. 1. The first linear electrodes 5a and the second linear electrodes 5b are provided alternately and substantially parallel to each other, with predetermined intervals therebetween. The second linear electrodes 5b are configured to be shielded from the readout light by color filter layers 6b, to be described later. The first linear electrodes 5a are charge pair generating electrodes, and the second linear electrodes 5b are charge pair non generating electrodes. That is, a configuration is adopted such that charge pairs for signal readout are not generated in the readout photoconductive layer 4 at positions corresponding to the second linear electrodes 5b. Here, the second electrode layer 5 is constituted by linear electrodes so as to facilitate correction of structural noise, to improve the S/N ratio of images by reducing the amount of data, and to shorten readout time by enabling parallel readout (mainly in a main scanning direction).

The first linear electrodes 5a and the second linear electrodes 5b may be formed by any material, as long as the material is transmissive with respect to the readout light and is conductive. In addition, it is necessary to secure flatness in order to avoid damage due to electrical field concentration during application of high voltage. Examples of materials for the first linear electrodes 5a and the second linear electrodes 5b include ITO (Indium Tin Oxide) and IZO (Indium Zinc Oxide), at a thickness greater than or equal to 0.05 μm and less than or equal to 1 μm. Alternatively, the first linear electrodes 5a and the second linear electrodes 5b may be formed by metals such as Al and Cr, at thicknesses that transmit the readout light (for example, approximately 10 nm).

The first linear electrodes 5a and the second linear electrodes 5b extend beyond the region in which each of the layers is stacked, and are connected to a signal detecting circuit board. The first linear electrodes 5a are employed as signal lines, whereas the second linear electrodes 5b are wired together outside the stacked region. If the widths of the first linear electrodes 5a and the second linear electrodes 5b are 10

μm and 20 μm, respectively, and the intervals therebetween are 10 μm for example, and adjacent first linear electrodes 5a and the second linear electrodes 5b are considered to be pairs, the pitch among each of the pairs can be set to 50 μm.

The protective layers 9 are provided at the edges of the first linear electrodes 5a and the second linear electrodes 5b, along the longitudinal directions thereof. Here, the "edges" refer to the side surfaces and portions of surfaces of the linear electrodes, which are continuous with the side surfaces, that face the recording photoconductive layer 2, as illustrated in FIG. 1 and FIG. 2. Providing the protective layers 9 at the edges of the linear electrodes, where electrical fields are likely to be concentrated, enables reductions in the amounts of charges injected into the electrodes from the edges thereof, which in turn suppresses the occurrence of image faults.

The interfaces B between the protective layers 9 and the recording photoconductive layer 2 are smooth surfaces across the entireties of the interfaces B, that is, the interfaces B have no angular portions therein. Further, it is preferable for the radius of curvature R at each point within the interfaces B to be 5 μm or greater. Thereby, cracking of the photoconductive layer due to local concentration of force at angular portions, and deterioration of electrical properties, can be prevented. In addition, the steps within a backing surface on which the photoconductive layer 2 is formed can be made smaller, and cutoff of the photoconductive layer 2 at the steps can be prevented.

Figure 3:
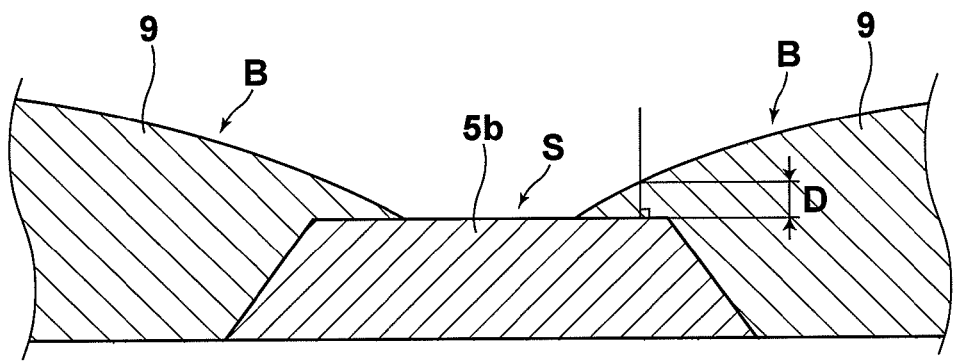
FIG. 3 is a diagram for explaining the thickness of protective layers within the flat panel.

The thickness D of a part of the protective layers 9, the part covering the portions of the surfaces of the divided electrodes 5a that face the photoconductive layer 2, are thicker toward the edges of the divided electrodes 5a. Here, the thickness D refers to the thickness of the protective layers 9 in a direction perpendicular to the direction in which the surfaces S of the portions of the divided electrodes that face the photoconductive layer 2 extend, as illustrated in FIG. 3. Cases in which there is a constant increase in the thickness D are preferred, but the thickness D may increase as a whole with portions that have uniform thicknesses as well.

In the case that the protective films that cover the entireties or the edges of divided electrodes are of a uniform thickness, electric fields which are formed during imaging of radiation images by a radiation image detector become greater at the edges of the divided electrodes than at the centers thereof. However, in the flat panel 10 of the radiation image detector of the present invention, the thickness of a part of the protective layers 9, the part covering the portions of the surfaces of the divided electrodes 5a that face the photoconductive layer 2, is thicker toward the edges of the divided electrodes 5a. Therefore, the uniformity of electric fields formed between the common electrode 1 and the divided electrodes 5a is improved.

Further, it is preferable for a contact angle θ formed by the interfaces B between the protective layers 9 and the photoconductive layer 2 and the surfaces S of the portions of the divided electrodes 5a that face the photoconductive layer 2 to be greater than or equal to 10 degrees and less than or equal to 65 degrees. Here, the contact angle θ refers to an angle formed by a surface at which an interface B contacts the portion of a divided electrode 5a that faces the photoconductive layer 2 with respect to the surface S of the portion of the divided electrode 5a that faces the photoconductive layer 2. When considering the contact angle θ, an angle formed by a tangent line that contacts an interface B and the surface S of the portion of the divided electrode 5a that faces the photoconductive layer 2 is used. The tangent line contacts the interface B at positions along the interface B between a protective film 9 and the recording photoconductive layer 2, as illustrated in the sectional view of FIG. 2.

Note that the protective layers 9 are provided at the edges of the electrodes with the contact angles θ so as to smoothly cover the surfaces of the electrodes without any steps being formed. Thereby, cracking of the recording photoconductive layer 2 can be prevented, and the effects thereof can be stably obtained. Note that if the contact angle θ is less than 5 degrees, it becomes difficult to manufacture the protective layers 9 in the manner described above. If the contact angle θ exceeds 65 degrees, cracks in the recording photoconductive layer 2 become likely to occur at regions above the protective layers 9.

The protective layers 9 may be formed by any material as long as it is insulative. The protective layers 9 may be formed by a material which is either transmissive or opaque with respect to the readout light. Examples of materials for the protective layers 9 include: novolac resin; acrylic resin; PVA (polyvinyl alcohol) film; PVP (polyvinyl pyrrolidone) film; PAA (polyacrylic acid) film; $SiO_2$; $Ta_2O_5$; $ZrO_2$; and $Al_2O_3$. The protective layers 9 are preferably of a sufficient thickness to prevent charge injection, and may have thicknesses greater than or equal to 0.05 μm and less than or equal to 5 μm. The protective layers may be formed by spin coating the aforementioned materials, then administering thermal processing.

Figure 4:
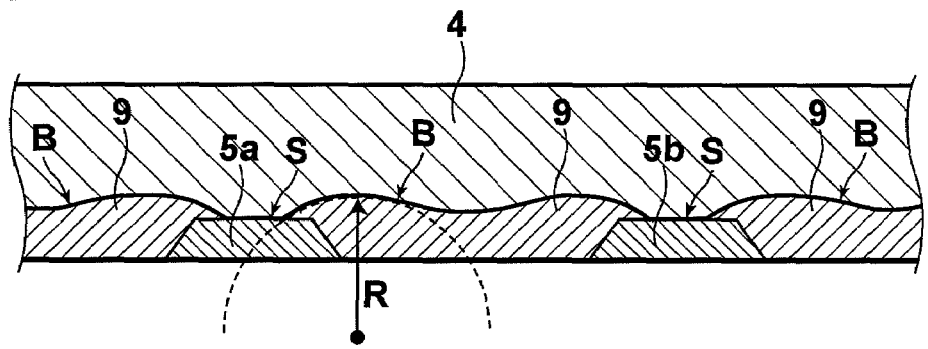
FIG. 4 illustrates a modified version of the flat panel of the first embodiment of the present invention.
Figure 5:
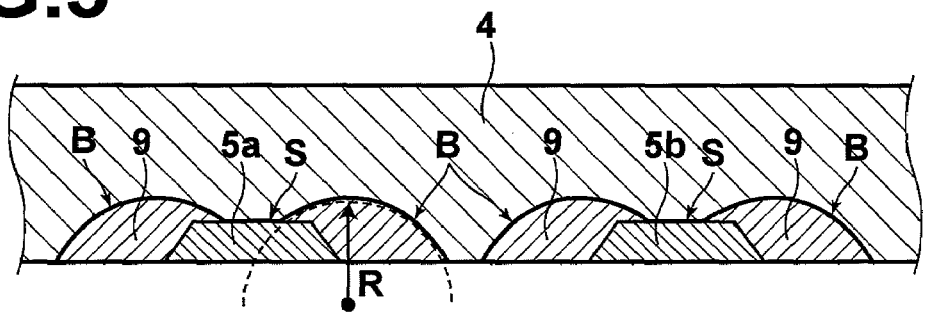
FIG. 5 illustrates another modified version of the flat panel of the first embodiment of the present invention.

Note that the interface B between the protective layer 9 formed between a first linear electrode 5a and a second linear electrode 5b and the recording photoconductive layer 2 is a continuous convex curved surface in the example illustrated in FIG. 1 and FIG. 2. However the present invention is not limited to this configuration. The interfaces B may be smooth convex curved surfaces at the edges of the edges of the linear electrodes, but smooth concave curved surfaces at portions away from the surfaces S that face the photoconductive layer, for example, as illustrated in FIG. 4. As a further alternative, individual protective layers 9 may be formed only at the edges of the first linear electrodes 5a and the second linear electrodes 5b, such that the interfaces B between the protective layers 9 and the recording photoconductive layer 2 are smooth surfaces as a whole, as illustrated in FIG. 5. In the examples illustrated in FIG. 4 and FIG. 5 as well, cracking of the photoconductive layer and deterioration of electrical properties can be prevented. IN addition, the uniformity of electrical fields formed between the common electrode and the divided electrodes can be improved. Note that only the relevant elements are illustrated in FIG. 4 and FIG. 5, to clearly illustrate the structures of the protective layers 9.

The transparent insulative layer 6a is insulative and transmissive with respect to the readout light. An acrylic resin may be employed as the material of the transparent insulative layer 6a. It is desirable for the thickness of the transparent insulative layer 6a to be approximately 1 μm or less.

The color filter layers 6b are provided at portions of the transparent insulative layer 6a corresponding to the second linear electrodes 5b. The color filter layers 6b are opaque with respect to the readout light. Examples of materials for the color filter layers 6b include: metals, such as Al, Mo, and Cr; and organic materials, such as $MoS_2$, $Wsi_2$, and TiN. The widths of the color filter layers 6b may be 30 μm, for example.

Because the color filter layers 6b prevent the readout light from entering the second linear electrodes 5b, charge pairs for signal readout are not generated in the readout photoconductive layer 4 at positions corresponding to the second linear electrodes 5b.

The substrate 7 may be formed by any material, as long as it is transmissive with respect to the readout light. Examples of such materials include glass and organic polymers.

Next, an example of the operation of the radiation image detector of the present invention will be described. First, a high voltage source applies a negative biasing voltage to the common electrode 1 of the flat panel 10, to form an electrical field between the common electrode 1 and the second electrode layer S. When the electrical field is formed, positive electric charges are charged in the first linear electrodes 5a and the second linear electrodes 5b of the second electrode layer S. Radiation is irradiated from a radiation source, such as an X-ray source, onto a subject in this state. The radiation, which has passed through the subject and bears a radiation image thereof, is irradiated onto the flat panel 10 from the side of the common electrode 1.

The radiation passes through the common electrode 1 and is irradiated onto the recording photoconductive layer 2. Thereby, charge pairs corresponding to the amount of radiation are generated in the recording photoconductive layer 2. Among the generated charge pairs, positive electric charges (positive holes) move toward the common electrode 1, combine with the negative charges which have been injected by the high voltage source, and disappear. Meanwhile, negative electric charges (electrons) from among the generated charge pairs move toward the second electrode layer 5 along the electrical field distribution formed by the application of the aforementioned voltage. The electrons are accumulated at the accumulating section 8 at the interface between the charge transfer layer 3 and the recording photoconductive layer 2. The amount of the accumulated charges is substantially proportionate to the dosage of the irradiated radiation, and represents the radiation image.

When the electrical field is formed, if the edges of the first linear electrodes 5a and the second linear electrodes 5b are not covered by the protective layers 9, the electrical fields will become concentrated at these edges, and charge injection will occur. However, the amount of injected charges can be reduced and image faults can be suppressed in the flat panel 10, because the protective layers 9 are provided.

When the radiation image which has been recorded in the flat panel 10 is read out, readout light is irradiated from the side of the substrate 7 in a state in which the common electrode 1 is grounded. The readout light, which is linear and extends in a direction perpendicular to the longitudinal direction of the linear electrodes of the second electrode layer 5, is scanned across the entire surface of the flat panel 10 in the longitudinal direction of the linear electrodes 5. The irradiation of the readout light causes charge pairs to be generated in the readout photoconductive layer 4 at positions corresponding to the scanning positions of the readout light. Note that the generation of charge pairs does not occur in portions of the readout photoconductive layer 4 that correspond to the second linear electrodes 5b, because the color filter layers 6b shield these portions from the readout light.

Positive charges from among the generated charge pairs move toward the latent image charges at the accumulating section 8, combine with the accumulated charges at the accumulating section 8, and disappear. Meanwhile, negative charges from among the charge pairs move toward the positive charges which are charged in the first linear electrodes 5a of the second electrode layer 5, combine with the positive charges, and disappear.

The above combinations of negative charges and positive charges cause electric currents to flow through current detecting amplifiers. The currents are integrated and detected as image signals, to perform readout of image signals corresponding to the radiation image.

Note that in the embodiment described above, negative electric charges are charged in the common electrode 1, and positive electric charges are charged in the divided electrodes. In addition, negative electric charges are accumulated at the accumulating section 8, which is formed at the interface between the recording photoconductive layer 2 and the charge transport layer 3. Further, the charge transport layer 3 functions as a positive hole transport layer, in which the motility of positive electric charges is greater than that of charges of the opposite polarity, that is, the accumulated electric charges (negative electric charges). However, the polarities of charges may be reversed.

Table 1 below illustrates the results of comparison of evaluation results regarding physical properties, photosensitive properties, and durability of Examples 1 through 3 and a Comparative Example 1. The radius of curvature R of the interface between protective layers and a photoconductive layer of Comparative Example 1 is 3 μm, and the radii of curvature R of the interfaces in Examples 1 through 3 are 5 μm or greater.

Note that acrylic resin having a specific dielectric constant of 3 was used as the material of the protective layers 9.

Here, the evaluations regarding physical properties were performed by observing the outer appearance of photoconductive layers, after exposing the radiation image detectors of the Comparative Example and the Examples to temperature cycles from 5° C. to 40° C. 15 times. If cracks or separation were observed, the physical properties of the radiation image detectors were evaluated as being "Poor". If no cracks or separation were observed, the physical properties of the radiation image detectors were evaluated as being "Good".

The evaluations regarding the photosensitive properties were performed by: applying predetermined biasing voltages between the common electrode and the divided electrodes of each radiation image detector; and obtaining the ratio between electrical signals which are detected when radiation is being irradiated (light current) and electrical signals which are detected when radiation is not being irradiated (dark current). If the light current/dark current ratio was greater than or equal to 90% and less than or equal to 100%, the photosensitive properties were evaluated as being "Good". If the light current/dark current ratio was between 50% and 90%, the photosensitive properties were evaluated as being "Fair". If the light current/dark current ratio was less than 50%, the photosensitive properties were judged to be outside an allowable range, and evaluated as being "Poor".

The evaluations regarding the durability were performed by performing accelerated tests in which: X-rays of a dosage 1R were irradiated onto the radiation image detectors 1000 times; predetermined voltages were applied to the radiation image detectors; and electrical signals were measured to evaluate dark current. If the measured dark current was less than 1.1 times that prior to the accelerated test, the durability was evaluated as being "Good". If the measured dark current was 1.1 times or greater but less than 1.5 times that prior to the accelerated test, the durability was evaluated as being "Fair". If the measured dark current was 1.5 times or greater than that prior to the accelerated test, the durability was evaluated as being "Poor".

TABLE 1

| | Radius of Curvature (μm) | Physical Properties | Photo-sensitive Properties | Durability | Total Evaluation |
|---|---|---|---|---|---|
| Comparative Example 1 | 3 | Poor | Poor | Fair | Poor |
| Example 1 | 5 | Good | Fair | Fair | Fair |
| Example 2 | 10 | Good | Good | Good | Good |
| Example 3 | 50 | Good | Good | Good | Good |

As illustrated in Table 1, Comparative Example 1, in which the radius of curvature of the interfaces between the protective layers and the photoconductive layer was less than 5 μm (3 μm), the total evaluation was judged to be outside an allowable range, and evaluated as "Poor". However, Examples 1 through 3, in which the radius of curvature R was 5 μm or greater, were evaluated as "Fair" or "Good", within an allowable range. It is clear that cracking of photoconductive layers and deterioration of electrical properties can be prevented in cases that the radius of curvature is 5 μm or greater. In addition, it is clear that the uniformity of electrical fields which are formed between common electrodes and divided electrodes is improved in cases that the radius of curvature is 5 μm or greater.

As described above, the radiation image detector of the present invention comprises: a photoconductive layer that generates charges when electromagnetic waves are irradiated thereon; a common electrode to which a predetermined voltage is applied, provided on one side of the photoconductive layer; a plurality of divided electrodes that output signals corresponding to charges which are generated within the photoconductive layer, provided on the other side of the photoconductive layer; and protective layers that cover the edges of the divided electrodes, the edges being the side surfaces and portions of surfaces of the divided electrodes, which are continuous with the side surfaces, that face the photoconductive layer. The interfaces between the protective layers and the photoconductive layer are smooth surfaces across the entireties thereof. That is, there are no angular portions in the interfaces. Therefore, cracking of the photoconductive layer due to localized force concentration at the angular portions can be prevented, as well as deterioration of electrical properties.

Note that it is desirable for the interfaces between the protective layers that cover the edges of all of the divided electrodes and the photoconductive layer to be smooth, and more preferably for the radius of curvature at the interfaces to be 5 µm or greater. However, the present invention is not limited to this configuration. Only the interfaces between the protective layers that cover the edges of the divided electrodes within an image region and the photoconductive layer may be smooth, and the radius of curvature at the interfaces may be 5 µm or greater.

The present invention is also not limited for application to radiation image detectors of the optical readout type, as described in the embodiment above. The present invention may also be applied to radiation image detectors of any type, for example, those of the TFT readout type.

Figure 6:
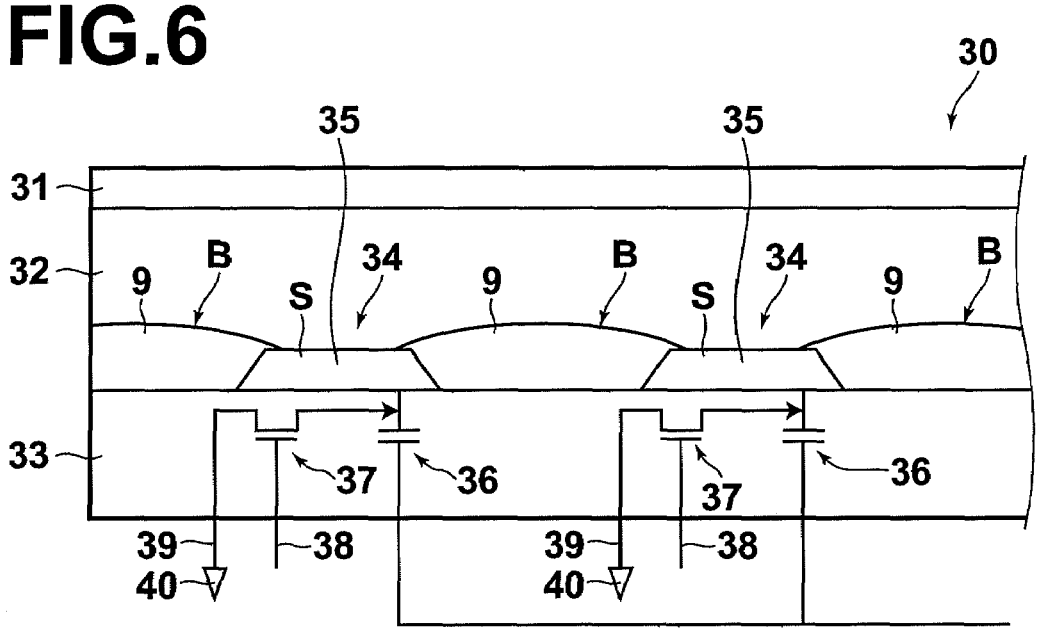
FIG. 6 is a sectional view that illustrates the schematic construction of a TFT readout type radiation image detector of the present invention.
Figure 7:
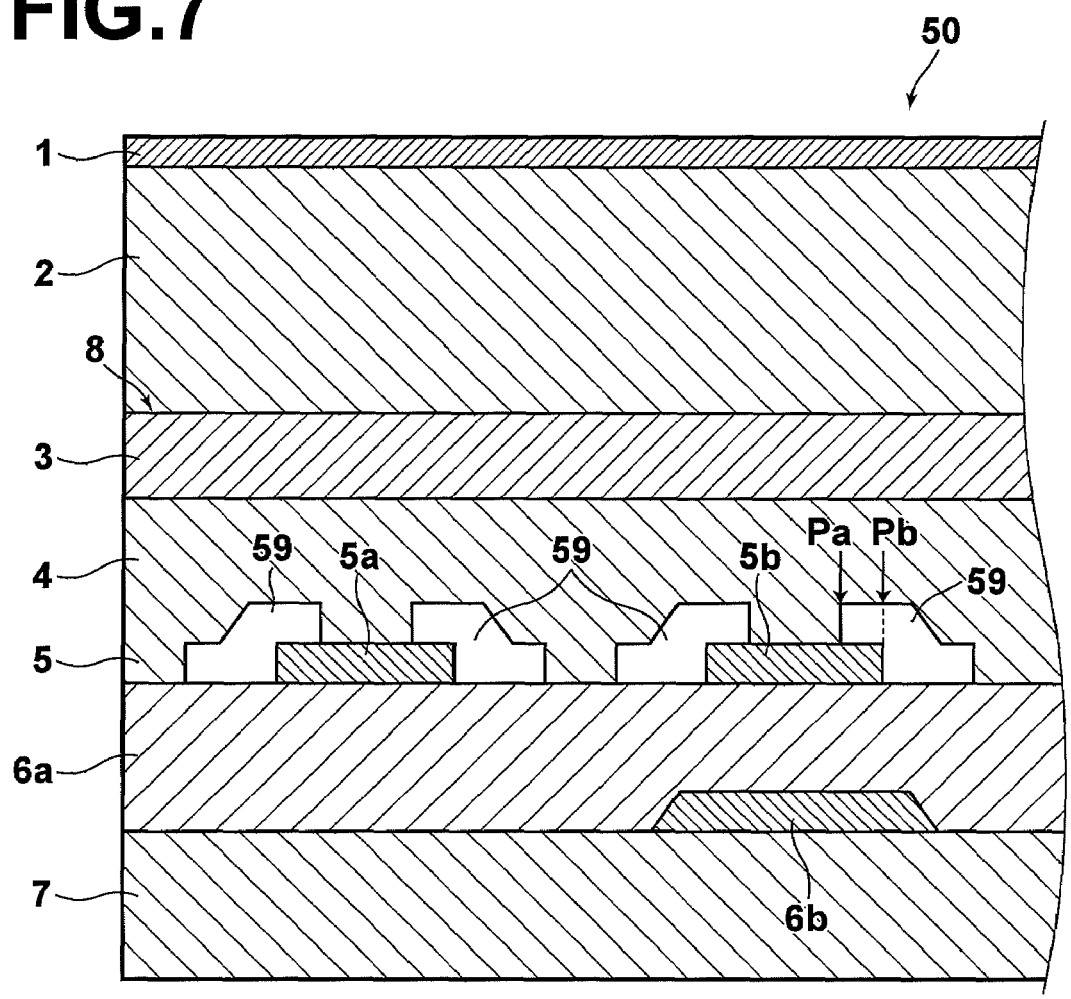
FIG. 7 is a diagram that illustrates the schematic construction of a flat panel of a conventional radiation image detector.

For example, a radiation image detector 30 illustrated in FIG. 6 is formed by stacking: a common electrode 31 that transmits recording electromagnetic waves bearing radiation image information; a photoconductive layer 32 that generates charges when irradiated by the recording electromagnetic waves transmitted through the common electrode 31; and a plurality of divided electrodes 35, which are detecting electrodes for detecting signals corresponding to the charges generated in the photoconductive layer 32; in this order. Each of the divided electrodes 35 is connected to an accumulating capacitor 36, for accumulating the electric charges collected by the divided electrode 35, and a switching element 37. Each combination of the divided electrode 35, the accumulating capacitor 36, and the switching element 37 constitutes a pixel portion 34. A charge detecting layer 33 is constituted by a great number of pixel portions 34, which are arranged two dimensionally. Protective layers 9 are provided at the edges of the divided electrodes 35. Here, the "edges" refer to the side surfaces and portions of surfaces of the divided electrodes 35, which are continuous with the side surfaces, that face the photoconductive layer 32. The interfaces B between the protective layers 9 and the photoconductive layer 32 are smooth surfaces across the entireties thereof. That is, there are no angular portions in the interfaces B. In addition, It is preferable for ht radius of curvature R at each point within the interfaces B to be 5 µm or greater. Further, the thickness D of a part of the protective layers 9, the part covering the portions of the surfaces of the divided electrodes 35 that face the photoconductive layer 32, may be thicker toward the edges of the divided electrodes 35. In this case, the uniformity of electric fields formed between the common electrode 31 and the divided electrodes 35 can be improved. Still further, it is preferable for the contact angle θ formed by the interfaces B between the protective layers 9 and the photoconductive layer 32 and the surfaces S of the portions of the divided electrodes 35 that face the photoconductive layer 32 to be greater than or equal to 10 degrees and less than or equal to 65 degrees.

The embodiments described above are so called direct conversion type radiation image detectors that record radiation images by receiving irradiation of radiation and directly converting the radiation into electrical charges. However, the present invention is not limited to these radiation image detectors. The present invention may also be applied to radiation image detectors of the so called indirect conversion type, in which radiation images are recorded by temporarily converting radiation to visible light, then converting the visible light to electrical charges.

What is claimed is:

1. A radiation image detector, comprising:
   a photoconductive layer that generates charges when electromagnetic waves are irradiated thereon;
   a common electrode to which a predetermined voltage is applied, provided on one side of the photoconductive layer;
   a plurality of divided electrodes that output signals corresponding to charges which are generated within the photoconductive layer, provided on the other side of the photoconductive layer; and
   protective layers that cover the edges of the divided electrodes, the edges being the side surfaces and portions of surfaces of the divided electrodes, which are continuous with the side surfaces, that face the photoconductive layer; wherein:
   the interfaces between the protective layers and the photoconductive layer are smooth surfaces across the entireties thereof.

2. A radiation image detector as defined in claim 1, wherein:
   the radius of curvature at the interfaces between the protective layers and the photoconductive layer is 5 µm or greater.

3. A radiation image detector as defined in claim 1, wherein:
   the thickness of a part of the protective layers, the part covering the portions of the surfaces of the divided electrodes that face the photoconductive layer, is thicker toward the edges of the divided electrodes.

4. A radiation image detector as defined in claim 1, wherein:
   the contact angle formed by the interfaces between the protective layers and the photoconductive layer and the surfaces of the portions of the divided electrodes that face the photoconductive layer is greater than or equal to 10 degrees and less than or equal to 65 degrees.

5. A radiation image detector as defined in claim 2, wherein:
   the thickness of a part of the protective layers, the part covering the portions of the surfaces of the divided electrodes that face the photoconductive layer, is thicker toward the edges of the divided electrodes.

6. A radiation image detector as defined in claim 2, wherein:
   the contact angle formed by the interfaces between the protective layers and the photoconductive layer and the surfaces of the portions of the divided electrodes that face the photoconductive layer is greater than or equal to 10 degrees and less than or equal to 65 degrees.

7. A radiation image detector as defined in claim 3, wherein:
   the contact angle formed by the interfaces between the protective layers and the photoconductive layer and the surfaces of the portions of the divided electrodes that face the photoconductive layer is greater than or equal to 10 degrees and less than or equal to 65 degrees.

* * * * *